United States Patent
Bales

(10) Patent No.: US 11,545,990 B2
(45) Date of Patent: Jan. 3, 2023

(54) DUTY-CYCLED ANALOG-TO-DIGITAL CONVERTER SYSTEM WITH PROGRAMMABLE FOREGROUND CALIBRATION

(71) Applicant: Omni Design Technologies Inc., Milpitas, CA (US)

(72) Inventor: James Edward Bales, Fort Collins, CO (US)

(73) Assignee: Omni Design Technologies, Inc., Milpitas, CA (US)

( * ) Notice: Subject to any disclaimer, the term of this patent is extended or adjusted under 35 U.S.C. 154(b) by 0 days.

(21) Appl. No.: 17/443,993

(22) Filed: Jul. 29, 2021

(65) Prior Publication Data
US 2022/0038110 A1     Feb. 3, 2022

Related U.S. Application Data

(60) Provisional application No. 63/058,617, filed on Jul. 30, 2020.

(51) Int. Cl.
*H03M 1/10*     (2006.01)
*H03M 1/12*     (2006.01)
*H03M 1/06*     (2006.01)

(52) U.S. Cl.
CPC ............ *H03M 1/1009* (2013.01); *H03M 1/06* (2013.01); *H03M 1/12* (2013.01); *H03M 1/124* (2013.01)

(58) Field of Classification Search
CPC ...... H03M 1/1009; H03M 1/06; H03M 1/124; H03M 1/12
See application file for complete search history.

(56) References Cited

U.S. PATENT DOCUMENTS 5,248,973 A * 9/1993 Babu ................... H03M 1/0643
341/122

\* cited by examiner

*Primary Examiner* — Joseph J Lauture
(74) *Attorney, Agent, or Firm* — Intrinsic Law Corp.

(57) ABSTRACT

An analog-to-digital conversion (ADC) system is operated with a duty cycle. During the ON period, the ADC circuits perform analog-to-digital conversions of an analog input signal. During the Standby period, the ADC system is in either a standby state or a foreground calibration state. The ADC system operates in a reduced-power mode in the standby state. In the foreground calibration state, the ADC system performs a portion of a foreground calibration cycle during a calibration time slot. The foreground calibration cycle is performed over multiple calibration time slots. The foreground calibration cycle and the calibration time slots are configurable by changing the values of control registers that represent calibration parameters.

19 Claims, 10 Drawing Sheets

DUTY-CYCLED ANALOG-TO-DIGITAL CONVERTER SYSTEM WITH PROGRAMMABLE FOREGROUND CALIBRATION

CROSS-REFERENCE TO RELATED APPLICATIONS

This application claims priority to U.S. Provisional Application No. 63/058,617, titled "Foreground Calibration In Duty-Cycled Analog-to-Digital Converters," filed on Jul. 30, 2020, which is hereby incorporated by reference.

TECHNICAL FIELD

This application relates generally to analog-to-digital converters (ADCs).

BACKGROUND

ADCs are generally calibrated in situ to improve their performance. There are generally two types of in situ calibration: background and foreground. Background calibrations are performed when the ADC is actively performing analog-to-digital conversions. Foreground calibrations are performed when the ADC is not actively performing analog-to-digital conversions, such as when the ADC is initially powered on and when the ADC is intentionally disabled for calibration purposes.

There are certain types of systems in which the ADC is only required to perform analog-to-digital conversions in periodic time intervals (e.g., duty cycles). In these systems, the ADC is placed in a reduced power supply current Standby state when the ADC is not performing the analog-to-digital conversions. This Standby state provides the opportunity to perform foreground calibration without affecting the overall operation of the system except that typically the power supply current is not reduced during foreground calibration.

FIG. 1 is an example timing diagram 10 of representative ADC calibrations. When the ADC is initially turned on, following a brief period for turn-on settling, foreground calibration processes are executed while the ADC is not in operational mode (ADC_READY=0). In this case, there is a capacitor calibration ("CAP CAL") followed by offset and gain calibration ("OFFSET/GAIN CAL"). Immediately following the initial turn-on calibration, the ADC is in operational mode (ADC_READY=1) and if background calibration is available and enabled, it executes in the background.

In the initial foreground calibration, the correction coefficient registers are set to zero. Measurements (averaging and multiple measurement conditions) of a known input signal are taken to compute an error estimate. Correction coefficients are then derived from the error estimate. These correction coefficients are written into the appropriate correction coefficient registers.

Background calibration differs from foreground calibration in that the correction coefficients are measured continuously from unknown input signals. It relies on certain input signal statistics. The correction coefficient registers are set based on previous estimate (e.g., the correction coefficient registers were set in the initial foreground calibration or in a subsequent background calibration). Background calibration includes a periodic computation of the residual error estimate, resulting in incremental updates to the correction coefficient registers.

Calibration processes typically require large amounts of computations (e.g., averaging) to achieve the required accuracy, and in many cases, there is insufficient time available to complete calibration in the off/Standby portion of the duty-cycled operation. This can be addressed by spreading the calibration process across several or many periods of duty-cycled operation. However, it is advantageous to match the calibration process to the duty cycle characteristics. Also, existing ADC calibration cannot minimize or control the variation in the duty-cycle characteristics of the current that the ADC draws from the power supply.

FIG. 2 is an example timing diagram 20 of representative duty-cycled operation of an ADC after initial turn on. In timing diagram 20, the ADC is operating with the foreground calibration values that were determined during initial turn-on foreground calibration (e.g., in timing diagram 10) or the most recent subsequent calibration performed during a Standby interval. The ADC duty cycle is controlled by the EN_ADC control signal and the status indicator ADC_READY indicates when the ADC is operational and completing valid analog-to-digital data conversions. When the ADC is in the Standby state, many circuits can be turned off or put into a low-power idle state that reduces the power supply current.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention. An aspect of the invention is directed to an analog-to-digital conversion system comprising: a plurality of analog-to-digital conversion circuits configured to perform analog-to-digital conversions, the analog-to-digital conversion circuits having a first input that is electrically coupled to an analog input signal; a plurality of digital error correction and formatting circuits having an input that is electrically coupled to an output of the analog-to-digital conversion circuits; a plurality of calibration measurement circuits having an input that is electrically coupled to an output of the digital error correction and formatting circuits; a plurality of calibration coefficient computation circuits having an input that is electrically coupled to an output of the calibration measurement circuits and an output that is electrically coupled to an input of the digital error correction and formatting circuits; a plurality of control registers that represent programmable foreground calibration parameters; a master controller having an output that is electrically coupled to the input of the analog-to-digital conversion circuits, the master controller configured for duty-cycled operation of the analog-to-digital conversion circuits, the duty-cycled operation including a plurality of duty cycle periods, each duty cycle period including (a) an ON period in which the analog-to-digital conversion circuits perform an analog-to-digital conversion of the analog input signal and (b) a standby period; and a digital calibration controller having a first output that is electrically coupled to the input of the analog-to-digital conversion circuits, a second output that is electrically coupled to the input of the calibration measurement circuits, and an input that is electrically coupled to the programmable control registers. The digital calibration controller is configured to perform a portion of a foreground calibration cycle during a respective calibration time slot in a respective standby period and/or in a respective ON period. The foreground calibration cycle and the respective calibration time slots are configurable according to the programmable foreground calibration parameters.

In one or more embodiments, a width of each respective calibration time slot is configurable according to the programmable foreground calibration parameters. In one or more embodiments, a number of measurement averages calculated in each calibration slot is configurable according to the programmable foreground calibration parameters. In one or more embodiments, a periodicity of the respective calibration time slots is configurable according to the programmable foreground calibration parameters. In one or more embodiments, a number of measurement conditions in the foreground calibration cycle is configurable according to the programmable foreground calibration parameters. In one or more embodiments, a number of the respective foreground calibration time slots over which measurement averages are calculated for each measurement condition is configurable according to the programmable foreground calibration parameters.

In one or more embodiments, the calibration measurement circuits are configured to measure one or more calibration signals; and the calibration coefficient computation circuits are configured to calculate updated calibration coefficient values based on calibration measurements from the calibration measurement circuits. In one or more embodiments, the analog-to-digital conversion circuits and the digital error correction and formatting circuits are configured to: receive the updated calibration coefficient values from the calibration coefficient computation circuits, and use the updated calibration coefficient values to improve an accuracy of the analog-to-digital conversion of the analog input signal.

In one or more embodiments, the respective calibration time slots are configurable to occur at a transition from the ON period to the standby period. In one or more embodiments, the respective calibration time slots are configurable to occur at a transition from the standby period to the ON period.

Another aspect of the invention is directed to a method comprising operating an analog-to-digital converter for multiple duty-cycle periods, each duty-cycle period including an ON period and a standby period; performing a respective analog-to-digital conversion of an analog input signal during the ON period of each duty-cycle period; placing the analog-to-digital converter in a standby state during the standby period of each duty-cycle period; prior to placing the analog-to-digital converter in the standby state, placing the analog-to-digital converter in a foreground calibration state during a plurality of the standby periods; dividing a foreground calibration cycle into a plurality of foreground calibration portions; performing a respective foreground calibration portion during a respective calibration time slot of the standby period while the ADC system is in the foreground calibration state; receiving an input signal that corresponds to one or more programmable foreground calibration parameters; and configuring the foreground calibration cycle and/or the respective calibration time slots according to the programmable foreground calibration parameter(s).

In one or more embodiments, the method further comprises updating a value of one or more programmable control registers according to the programmable calibration parameter(s). In one or more embodiments, the method further comprises configuring the width of each respective calibration slot according to the programmable calibration parameter(s). In one or more embodiments, the method further comprises configuring a number of measurement averages calculated in each respective calibration slot. In one or more embodiments, the method further comprises configuring a periodicity of the respective calibration time slots. In one or more embodiments, the method further comprises configuring a number of measurement conditions in the foreground calibration cycle. In one or more embodiments, the method further comprises configuring a number of the respective calibration time slots over which measurement averages are calculated for each measurement condition.

In one or more embodiments, the method further comprises measuring one or more calibration signals with calibration measurement circuits; calculating updated calibration coefficient values with calibration coefficient computation circuits based on calibration measurements of the one or more calibration signals; and improving an accuracy of the respective analog-to-digital conversion using the updated calibration coefficient values.

Another aspect of the invention is directed to a method comprising: operating an analog-to-digital converter for multiple duty-cycle periods, each duty-cycle period including an ON period and a standby period; performing a respective analog-to-digital conversion of an analog input signal during the ON period of each duty-cycle period; placing the analog-to-digital converter in an ON state during the ON period of each duty-cycle period; prior to placing the analog-to-digital converter in the ON state, placing the analog-to-digital converter in a foreground calibration state during a plurality of the ON periods; dividing a foreground calibration cycle into a plurality of foreground calibration portions; performing a respective foreground calibration portion during a respective calibration time slot of the ON period while the ADC system is in the foreground calibration state; receiving an input signal that corresponds to one or more programmable foreground calibration parameters; and configuring the foreground calibration cycle and/or the respective calibration time slots according to the programmable foreground calibration parameter(s).

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

As aspect of the invention relates to an ADC system in which foreground calibration (e.g., foreground gain and offset calibration) is programmably controllably implemented in Standby periods during duty-cycled ADC operation. In foreground calibration during Standby periods, measurements (averaging and multiple measurement conditions) of a known input signal are performed. The correction coefficient registers are set based on previous estimates (e.g., the correction coefficient registers were set in the initial foreground calibration or in a subsequent background calibration). Background calibration includes a computation of the residual error estimate, resulting in incremental updates to the correction coefficient registers. It must be noted that aspects of the invention can be easily extended to calibration of other errors such as capacitor mismatch and timing skew.

Typically, gain and offset are determined for an ADC system assuming it has a linear transfer function and solving the equation y=m*x+b for m (gain) and b (offset) for two known input values of x. Since an ADC may not be perfectly linear, an improved estimate of the least-squares linear fit can be obtained be performing the measurement for multiple input values. For this example, the error estimate can be made using measurement pairs, which refer to the two measurements (e.g., a single measurement condition without averaging) required for an estimate of offset and gain, across multiple measurement conditions, where a measurement condition is a specific measurement pair of calibration signal values. A full calibration cycle usually requires averaging of many measurements to reduce the effect of noise.

One problem in existing duty-cycled ADCs that implement foreground calibration is for a given value of calibration measurement averaging, a certain calibration period is required and if the available period during the Standby mode is insufficient, the calibration is spread over multiple calibration periods. In this case, a certain combination of length and number of calibration periods is required. If the Standby period is variable, it may not be possible to optimize the full calibration cycle for all possible Standby periods. A second problem is that the inclusion of a calibration period between the ON and Standby states modulates the duty cycle of the power supply current. This may have undesirable effects on system operation characteristics and/or performance.

The disclosed ADC system and method can address these problems by providing programmable control of the foreground calibration cycle and calibration time slots during duty-cycled operation. It is noted that the duty cycle can be modulated in some embodiments. Specifically, ADC system can programmably control the total amount of averaging, the time allocated to calibration in Standby periods, and/or the ability to omit calibration during Standby periods within a calibration cycle.

Figure 1:
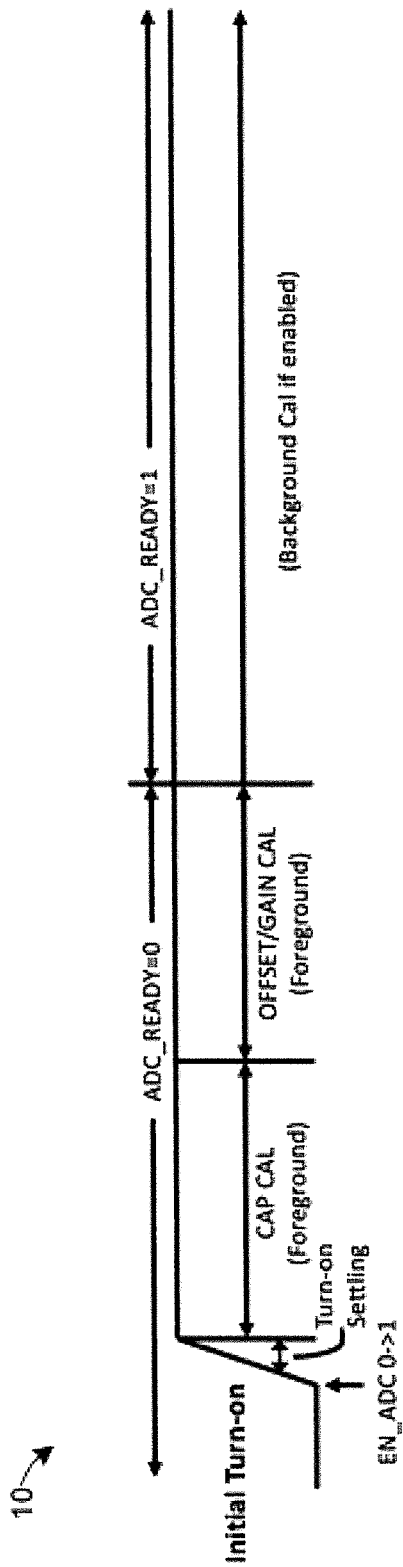
FIG. 1 is an example timing diagram of representative ADC calibrations according to the prior art.
Figure 2:
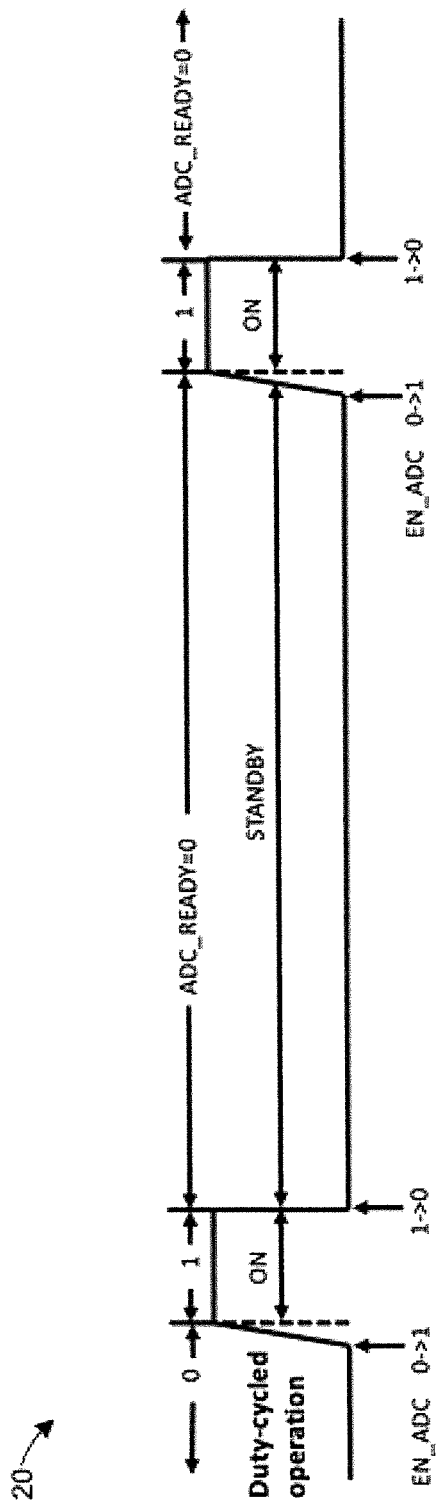
FIG. 2 is an example timing diagram of representative duty-cycled operation of an ADC after initial turn on, according to the prior art.
Figure 3:
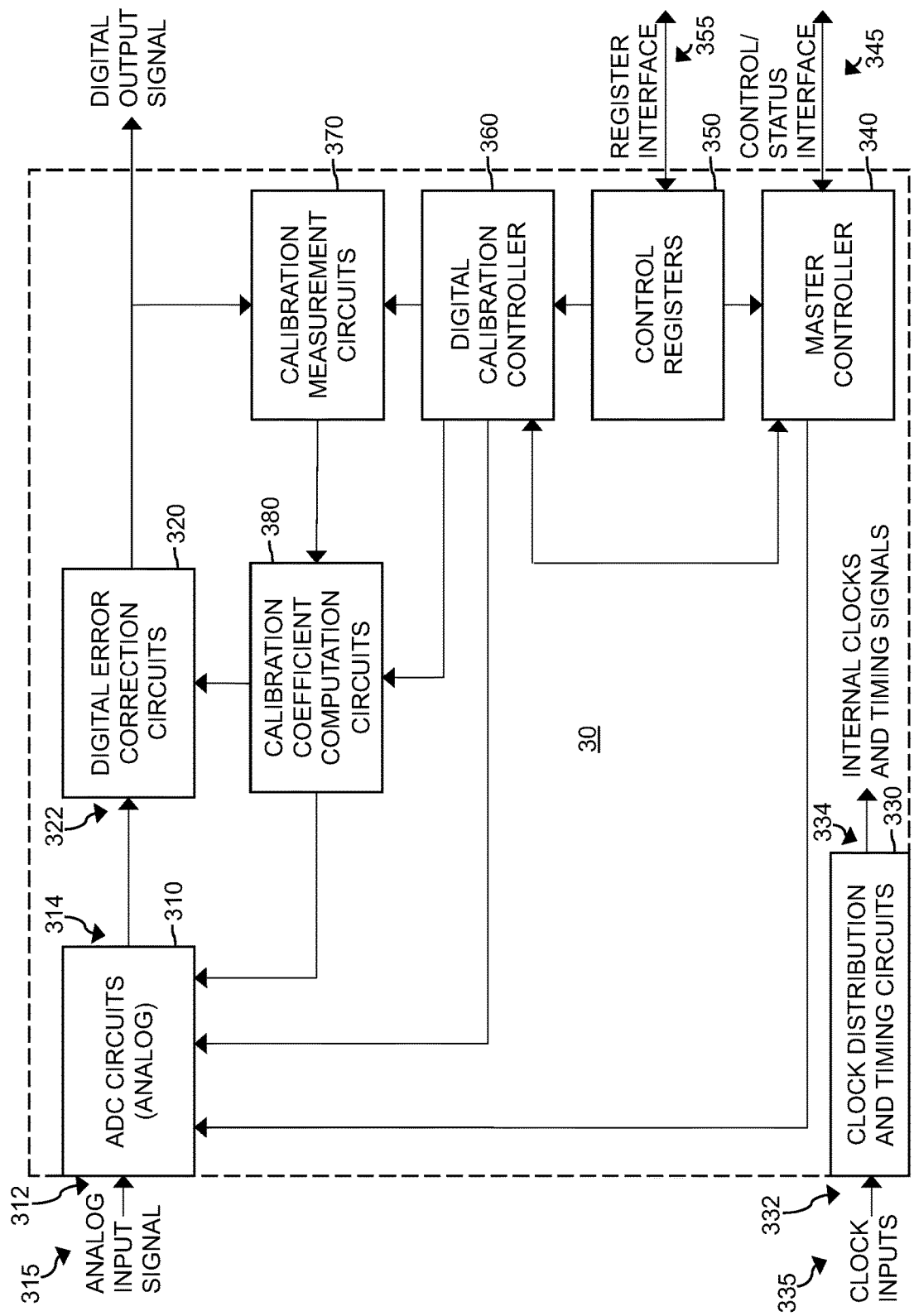
FIG. 3 is a block diagram of an ADC system according to an embodiment.

FIG. 3 is a block diagram of an ADC system 30 according to an embodiment. The ADC system 30 includes a plurality of ADC circuits 310, a plurality of digital error correction circuits 320, a plurality of clock distribution and timing circuits 330, a master controller 340, a plurality of programmable control registers 350, a calibration controller 360, a plurality of calibration measurement circuits 370, and a plurality of calibration coefficient computation circuits 380.

The ADC circuits 310 are configured to perform an analog-to-digital conversion of an analog input signal 315, which is electrically coupled to a first input 312 of the ADC circuits 310. The output 314 of the ADC circuits 310 is electrically coupled to an input 322 of the digital error correction circuits 320. The ADC circuits 310 and the digital error correction circuits 320 can include trim circuits that can apply correction coefficients (e.g., for offset, gain, and/or capacitance) to improve the accuracy and/or other characteristic of the analog-to-digital conversion process. The correction coefficients can be initially calculated in foreground calibration during the initial turn-on and then recalculated in foreground calibration that occurs during duty-cycled operation of the ADC system 30.

The clock distribution and timing circuits 330 have an input 332 that is electrically coupled to one or more clock input signals 335. An output 334 of the clock distribution and timing circuits 330 provides the necessary internal clock and timing signals to the ADC system 30. Electrical connections between the clock distribution and timing circuits 330 and the other components of ADC system 30 are not illustrated in FIG. 3 for clarity purposes only.

The master controller 340 can generate signals that control the operation and state of the ADC system 30. The master controller 340 is electrically coupled to the programmable control registers 350, the calibration controller 360, and a control/status interface 345. In addition, an output of the master controller 340 is electrically coupled to an input of the ADC circuits 310. The operation and/or functional characteristics of the master controller 340 can be programmed for different behavior through the programmable control registers 350. The values of the programmable control registers 350 can be changed through a register access interface 355. The master controller 340 can comprise or consist of a microcontroller, a state machine, a system-on-a-chip (SoC), or other digital logic.

The calibration controller 360 has inputs that are electrically coupled to the master controller 340 and to the programmable control registers 350. Signals from the master controller 340 and the values of the programmable registers 350 can be used by the calibration controller 360 to determine the timing and parameters of the duty-cycled foreground calibration process. During the duty-cycled foreground calibration process, the calibration controller 360 provides control signals to various parts of the ADC system 30. For example, the calibration controller 360 has a first output that is electrically coupled to an input of the calibration measurement circuits 370, a second output that is electrically coupled to an input of the calibration coefficient computation circuits 380, and a third output that is electrically coupled to an input of the ADC circuits 310. Alternatively, the calibration controller 360 can be in electrical communication with the calibration coefficient computation circuits 380 via the calibration measurement circuits 370. The calibration controller 360 can comprise or consist of a microcontroller, a state machine, a SoC, or other digital logic.

In operation, the master controller 340 can send a control signal (e.g., an EN_ADC control signal) to the ADC circuits 310. The control signal can cause the ADC circuits 310 to perform the analog-to-digital conversions of the analog input signal 315 in duty cycles. The control signal can also set the duty-cycle period and the duty-cycle percentage (e.g., the percentage of "on" or active time in each duty-cycle period for performing the analog-to-digital conversions). These duty-cycle parameters (e.g., whether duty-cycled operation is enabled, the duty-cycle period, and the duty-cycle percentage) can be set (e.g., by a user) using the control/status interface 345. The master controller 340 also sends the duty-cycle parameters to the digital calibration controller 360. In addition, the master controller 340 sends a calibration initiation control signal (e.g., an EN_OLCAL control signal) to the ADC circuits 310 and to the calibration controller 360 that causes the ADC circuits 310 to initiate a duty-cycled foreground calibration cycle during a calibration time slot in the Standby period of one or more duty-cycle periods of the ADC system 30. The master controller 340 can send the calibration initiation control signal in response to measurements from one or more sensors (e.g., a temperature sensor, a voltage sensor, and/or another sensor) that can indicate a need for recalibration. For example, if the temperature sensor indicates that the temperature has drifted by more than 1 degree Celsius and/or that the supply voltage has drifted by more than 5%, then duty-cycled foreground calibration may be needed or desired.

After the master controller 340 sends the calibration initiation control signal, the digital calibration controller 360 generates control signals that control one or more characteristics or properties of the duty-cycled foreground calibration cycle, which occurs in a calibration time slot during the Standby period of one or more duty-cycle periods of the ADC circuits 310. The portion of the Standby period used to perform a portion of a foreground calibration cycle can be referred to as a calibration time slot. In other words, digital calibration controller 360 can divide a foreground calibration cycle into a plurality of portions to be performed in respective calibration time slots. The calibration controller 360 can use the values in the programmable control registers 350 to programmably set the width of the calibration time slot, the periodicity of the calibration time slot, the number of calibration time slots in each foreground calibration cycle, the number of measurement conditions in each foreground calibration cycle, and/or the number of calibration time slots for each measurement condition. Thus, the values of the programmable control registers 350 can be updated to configure and/or programmably set the duty-cycled foreground calibration cycle (e.g., one or more characteristics or properties of the duty-cycled foreground calibration cycle) and/or calibration time slots, including the width, periodicity, and number of calibration time slots.

The calibration controller 360 also sends control signals to the calibration measurement circuits 370 to control the measurements for the current calibration cycle. When a calibration measurement is completed, the calibration controller 360 sends a signal that instructs the calibration coefficient computation circuits 380 to determine the required calibration coefficients using the calibration measurements made by the calibration measurement circuits 370. The calibration coefficients are then provided from the calibration coefficient computation circuits 380 to the digitally-controlled analog trim circuits in the ADC circuits 310 and to the digital error correction circuits 320. The ADC circuits 310 and the digital error correction circuits 320 use the updated calibration coefficient values to correct the analog-to-digital conversions of the analog input signal made by the ADC circuits 310 during the ON periods.

Figure 4:
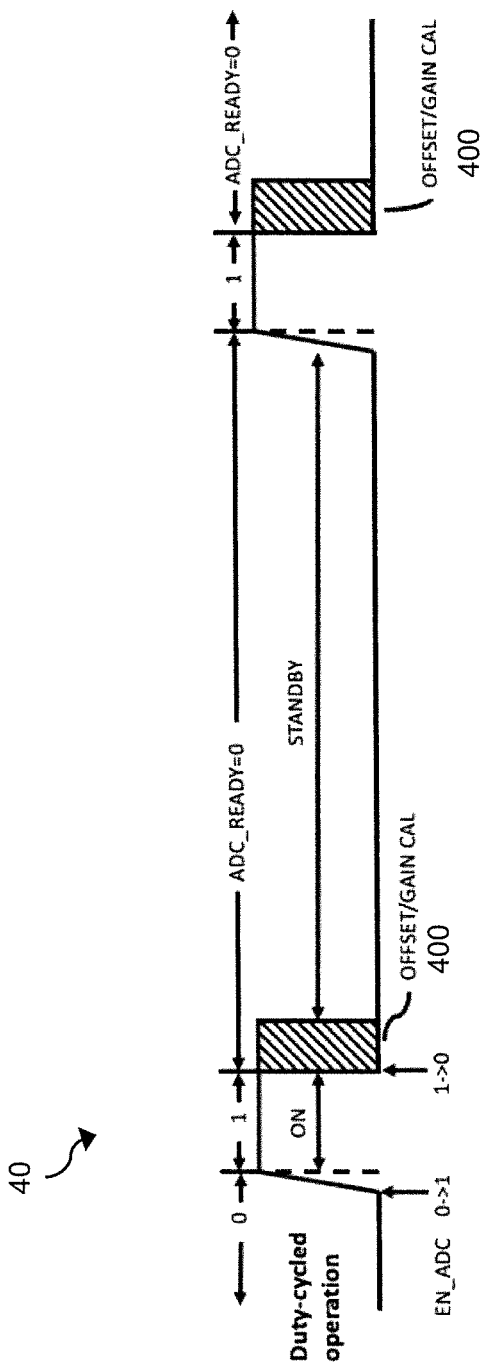
FIG. 4 is an example timing diagram of representative duty-cycled operation of the ADC system of FIG. 3, after initial turn on, with foreground ADC calibration while the ADC system is in Standby mode.

FIG. 4 is an example timing diagram 40 of representative duty-cycled operation of ADC system 30, after initial turn on, with foreground ADC calibration while the ADC system 30 is in Standby mode. In this case, immediately following the control signal instruction to enter Standby (i.e., EN_ADC signal from the master controller 340 switches from 1 to 0 and ADC_READY switches from 1 to 0), a period of foreground calibration is performed during calibration time slot 400. During calibration time slot 400, the ADC circuits 310 do not perform data conversions with respect to the analog input signal 315, but the ADC circuits 310 remain active and consume power supply current. An example of the foreground calibration that might be executed is to disconnect the analog input signal 315 and then connect a known input signal, such as a reference voltage or ground signal, for measurement. Following measurement, the result is compared to an expected value and the correction parameters are determined and applied during ADC operation after the calibration cycle is complete. A full calibration cycle usually requires averaging of many measurements to reduce the effect of noise. If there is insufficient time to complete these measurements within the Standby period, the calibration may be performed over multiple calibration time slots 400.

There are several problems in existing ADC systems in which duty-cycled foreground calibration is not programmably controllable. One problem is that for a given value of calibration measurement averaging, a certain calibration period is required and if the available period during one Standby period is insufficient, the calibration is spread over multiple calibration periods. In this case, a certain combination of length and number of calibration periods is required. If the Standby period is variable, it may not be possible to optimize the full calibration cycle for all possible Standby periods. A second problem is that the inclusion of a calibration period between the ON and Standby states modulates the duty cycle of the power supply current. This may have undesirable effects on system operation characteristics and/or performance.

Aspects of the invention can address these problems by providing programmable control of the foreground calibration cycle and/or calibration time periods during duty-cycled operation of the ADC circuits. For example, the total amount of averaging, the number of measurement conditions, the time allocated to calibration in each Standby period (e.g., the width or duration of the calibration time slot 400), and the ability to omit calibration time slots during 400 Standby periods within a calibration cycle can be programmably set.

Figure 5A:
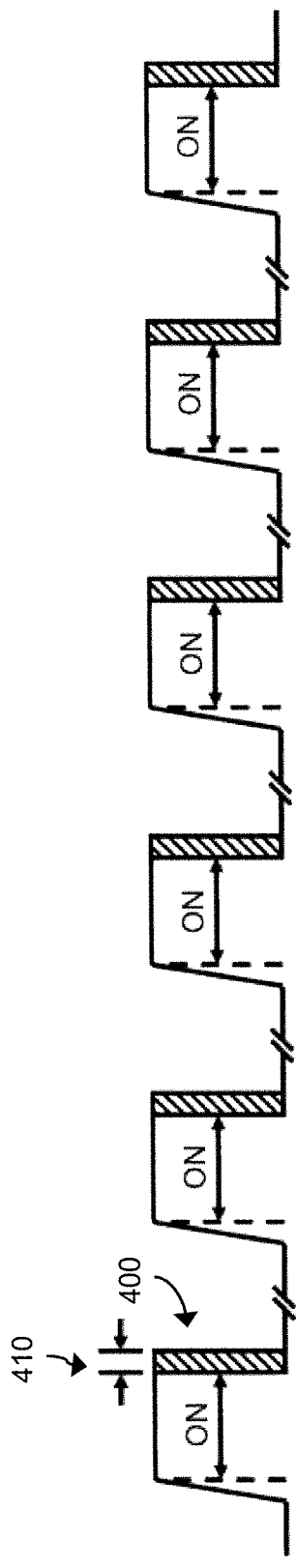
FIGS. 5A-C are example timing diagrams to illustrate various programmable features of foreground ADC calibration according to an embodiment.
Figure 5B:
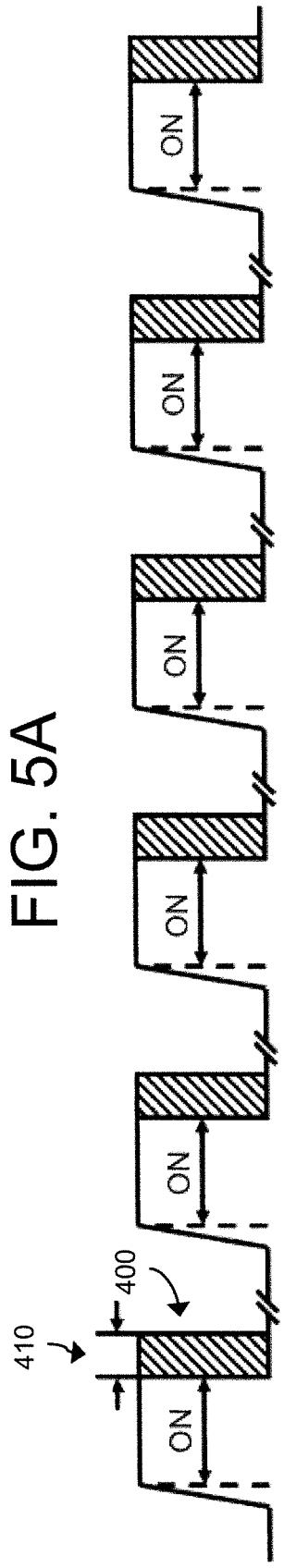
Figure 5C:
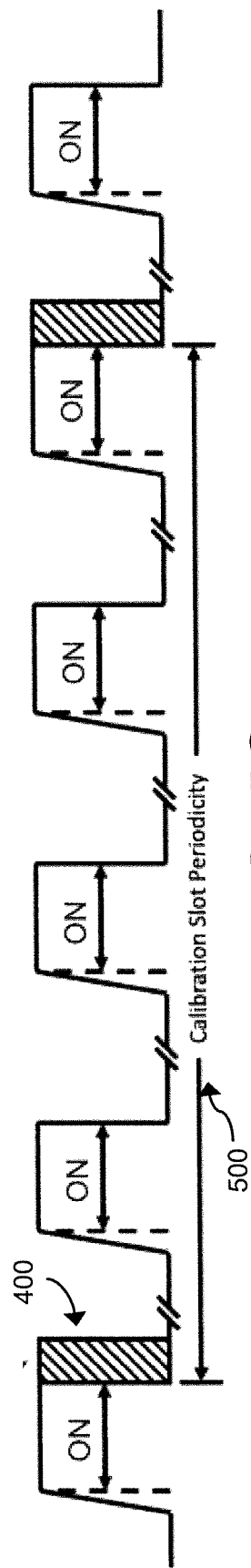

Some of the features of programmable control of the foreground calibration cycle during duty-cycled operation are illustrated in example timing diagrams in FIGS. 5A-C. A relatively short time allocated to foreground calibration in a Standby period, referred to as a width 410 of the calibration time slot 400, is shown in FIG. 5A. A relatively longer time allocated to foreground calibration in a Standby period (i.e., a longer width 410 of the calibration time slot 400) is shown in FIG. 5B. Omission of a calibration time slot 400 during one or more Standby periods within a calibration cycle is illustrated in FIG. 5C. Thus, the periodicity 500 of the calibration time slots 400 within a calibration cycle can be programmably controlled. In FIG. 5C, the periodicity 500 is 4 such that a calibration time slot 400 occurs every 4 Standby periods. In general, the periodicity can be N where N has a range of 1 to 100 or another range.

Table 1 is an example of programmable calibration parameters that can be stored in programmable control registers 350 to programmably control duty-cycled foreground calibration. A calibration cycle refers to a full calibration process executed across one or more calibration time slots, culminating in an update to error correction registers in digital error correction circuits 320. The full calibration process may include multiple measurement conditions (e.g., specific pairs of calibration signal values) and averaging of many measurements of each measurement condition.

TABLE 1

| PARAMETER | REGISTER | DEFAULT | VALUE | MAXIMUM |
|---|---|---|---|---|
| A | OLCAL_NUM_AVG[3:0] | 'd7 | $2^7 = 128$ | $2^{15} = 32,768$ |
| N | OLCAL_NUM_SLOTS[2:0] | 'd0 | $2^0 = 1$ | $2^7 = 128$ |
| M | OLCAL_NUM_MEAS[1:0] | 'd3 | $2^3 = 8$ | $2^3 = 8$ |
| S | OLCAL_NEXT_SLOT[3:0] | 'd0 | $2^0 = 1$ | $2^{15} = 32,768$ |

Parameter A (register OLCAL_NUM_AVG) represents the number of measurement averages that are calculated within a calibration time slot (e.g., calibration time slot 400), thus directly controlling the calibration time slot width (e.g., width 410). The calibration time slot refers to the time period for calibration between the ON state and the Standby state of the ADC (e.g., when the EN_ADC control signal transitions from 0 to 1). The calibration time slot width refers to the number of clock periods (alternatively expressed as time) in a calibration time slot, where the clock periods are ADC clock periods (e.g., a clock operating at 312.5 MHz has a clock period of 3.2 ns). Parameter N (register OLCAL_NUM_SLOTS) represents the number of calibration time slots over which averaging will be performed for each measurement condition. Parameter M (register OLCAL_NUM_MEAS) controls the number of measurement conditions for the calibration cycle. Note that the measurement conditions are typically defined in other registers. Parameter S (register OLCAL_NEXT_SLOT) controls the calibration time slot periodicity (e.g., an active time slot periodicity factor). The total number of duty cycle periods required to complete a calibration cycle is N*M*S.

In summary, a first group of registers (associated with parameter A) can be programmably set to define the number of averages that are calculated within a calibration time slot (e.g., calibration time slot 400), which is equal to the calibration time slot width. A second group of registers (associated with parameter N) can be programmably set to define the time slots over which averaging is performed for each measurement condition (a specific measurement pair of calibration signal values). A third group of registers (associated with parameter M) can be programmably set to define the number of measurement conditions for the calibration cycle. A fourth group of registers (associated with parameter S) can be programmably set to define the calibration time slot periodicity (e.g., the number of Standby states between each calibration time slot). Thus, the second, third, and fourth groups of registers can be programmably set to define the number of duty cycle periods required to complete a calibration cycle.

For example, consider a time-interleaved ADC that comprises 16 sub-ADC channels and digital backend circuits operating at a clock rate of 1/8 the time-interleaved sampling rate. In this case it takes 2 clock cycles to complete a single measurement on the 16 sub-ADC channels that comprise the ADC, and 2 measurements are needed. The total clock cycles for each calibration time slot can be calculated as 2*2*A+B where B represents measurement setup overhead and A is parameter A (the number of averages that are calculated within a calibration time slot as described in the preceding paragraph). When A is 128, approximately 528 clock cycles are needed for each calibration time slot if B is approximately 16. If the clock period is 3.2 ns (clock operates at 312.5 MHz), then about 1.69 microseconds are needed for each calibration time slot.

Figure 6:
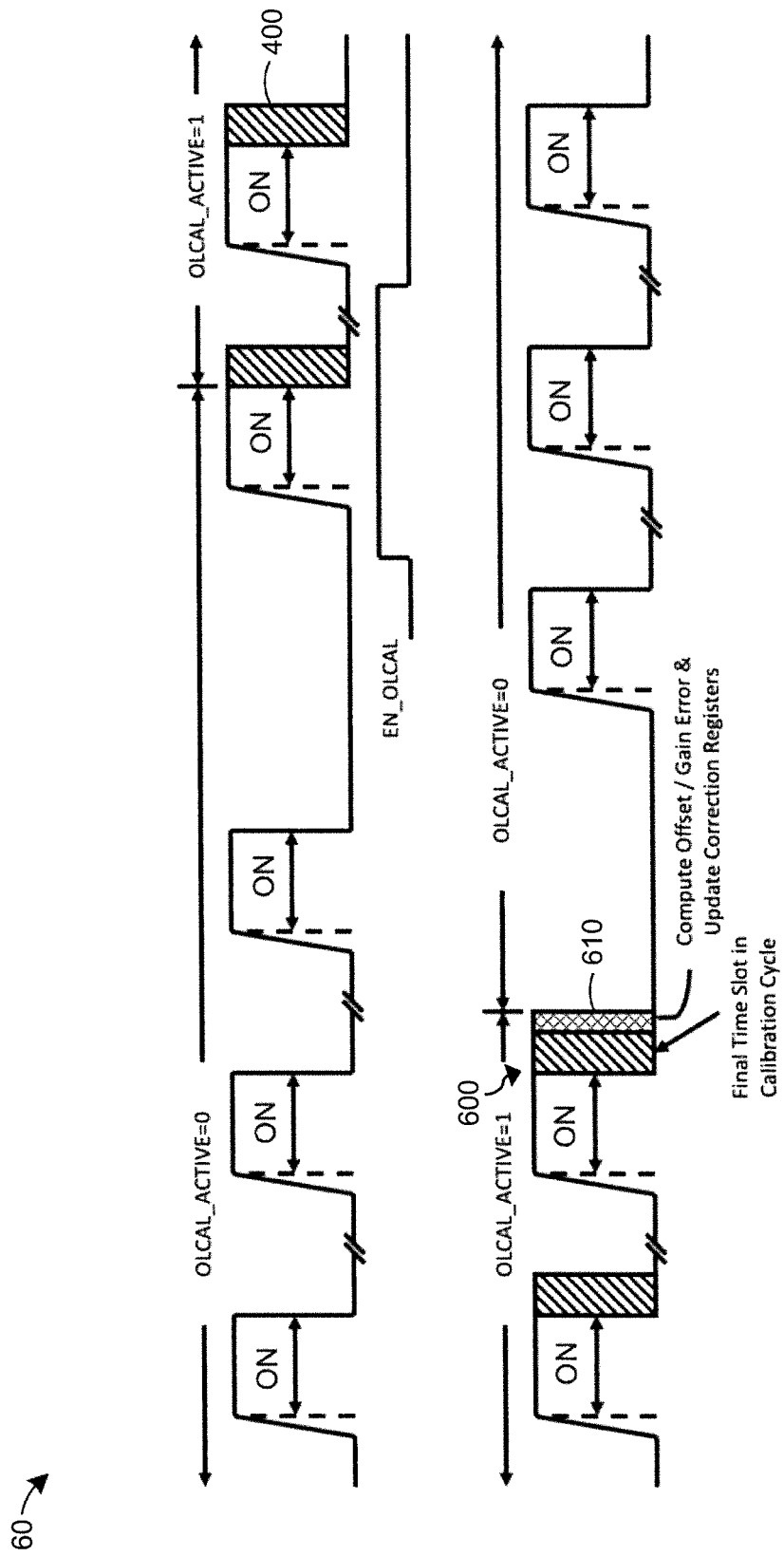
FIG. 6 is an example timing diagram of representative duty-cycled operation of the ADC system of FIG. 3 after initial turn on, with foreground ADC calibration while the ADC system is in Standby mode.

FIG. 6 is an example timing diagram 60 of representative duty-cycled operation of ADC system 30, after initial turn on, with foreground ADC calibration while the ADC system is in Standby mode. The timing diagram 60 illustrates that the duty-cycled foreground calibration is performed over multiple calibration time slots 400. Duty-cycled foreground calibration starts after the EN_OLCAL (enable offline calibration input) signal transitions from 0 to 1. The OLCAL_ACTIVE (offline calibration active) status output signal transitions from 0 to 1 when duty-cycled foreground ADC calibration occurs. The OLCAL_ACTIVE signal can be generated by the calibration controller 360. The offset and gain errors are calculated in calculation slot 610 after the final calibration time slot 600. The error correction registers are also updated in calculation slot 610. After calculation slot 610, the OLCAL_ACTIVE status output signal transitions from 1 to 0. EN_OLCAL and OLCAL_ACTIVE can be directly accessible through device pins or indirectly accessible through registers (e.g., control registers 350) that are accessed through a register access interface (e.g., register access interface 355).

Figure 7:
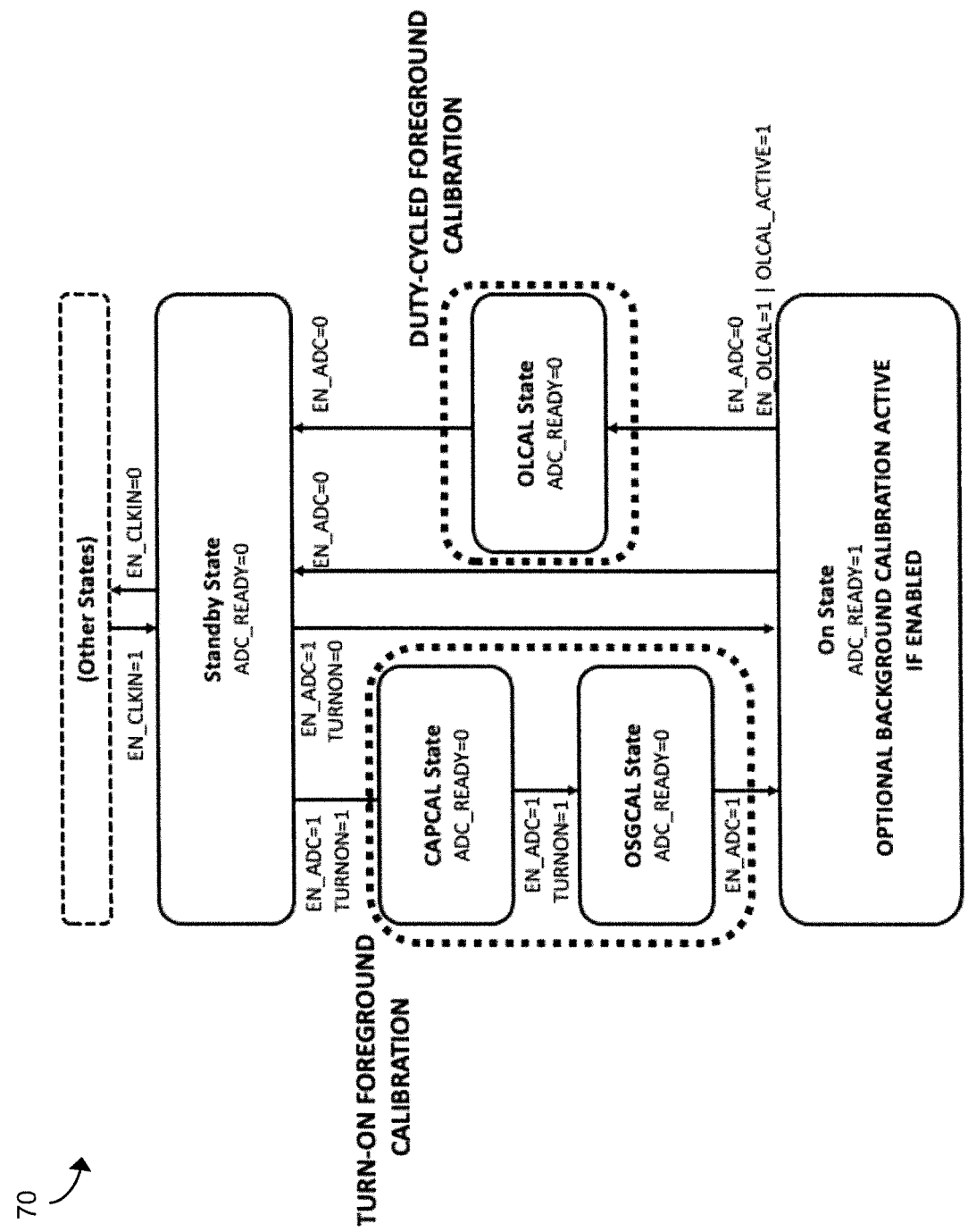
FIG. 7 is a state diagram of the ADC system of FIG. 3 to illustrate when the ADC system can enter different calibration modes, according to an embodiment.

FIG. 7 is a state diagram 70 of ADC system 30 to illustrate when the ADC can enter different calibration modes according to an embodiment. Since calibration processes typically must occur while the ADC is active (but not performing valid analog-to-digital conversions), they must occur when the ADC is in either the Standby state or in the ON or active state. The ON state is when the ADC is performing valid analog-to-digital conversions. The Standby state is when the ADC is in a power-savings mode from which it can be switched to the ON state rapidly.

During initial turn-on, the ADC may transition through several states ((Other States) in FIG. 7) before it enters the Standby state for the first time. Next, the ADC system transitions from the Standby state to the ON state, which is initiated by the enable ADC control signal EN_ADC transitioning from 0 to 1. Immediately after the EN_ADC transitions from 0 to 1, the turn-on foreground calibration processes are completed, which are initiated by the TURNON control signal (e.g., generated by master controller 340) transitioning from 0 to 1. After the initial turn-on foreground calibration processes are completed, the ADC system transitions to the ON or active state at which time the status indicator signal ADC_READY (e.g., generated by master controller 340) transitions from 0 to 1.

Subsequent transitions from the Standby state to the ON state are direct (omitting the foreground calibration states) unless duty-cycled foreground calibration is initiated by the master controller 340 asserting EN_OLCAL=1 (i.e., transitioning EN_OLCAL from 0 to 1). Once in the ON state for the first time, the ADC system can be operated in a duty-cycled manner alternating between Standby and ON states, controlled by EN_ADC (transitioning to 0 and 1, respectively), which is asserted by the master controller 340. While in this duty-cycled mode of operation, duty-cycled foreground calibration is initiated when the master controller 340 asserts EN_OLCAL=1. The first time a transition out of the ON state after EN_OLCAL=1, the OLCAL (offline calibration) state is entered and the status indicator OLCAL_ACTIVE is set high (OLCAL_ACTIVE=1) by the calibration controller 360. The time in the OLCAL state depends on the programmable parameters that have been loaded into the calibration cycle parameters registers (e.g., in control registers 350). Subsequent transitions from the ON state to the Standby state will be through the OLCAL state until the calibration cycle is complete and OLCAL_ACTIVE is set low (OLCAL_ACTIVE=0). After calibration cycle completion, the following On state to Standby state transition will bypass the OLCAL state unless EN_OLCAL=1, which would initiate a new calibration cycle.

Additionally or alternatively, duty-cycled foreground calibration can be performed in the transition from the Standby state to the ON state. For example, a time slot can be added to the end of the Standby state and/or to the beginning of the ON state just prior to performing the analog-to-digital conversion. The programmable foreground calibration parameters can determine whether the duty-cycled foreground calibration is performed in the transition from the Standby state to the ON state and/or the transition from the ON state to the Standby state.

Figure 8:
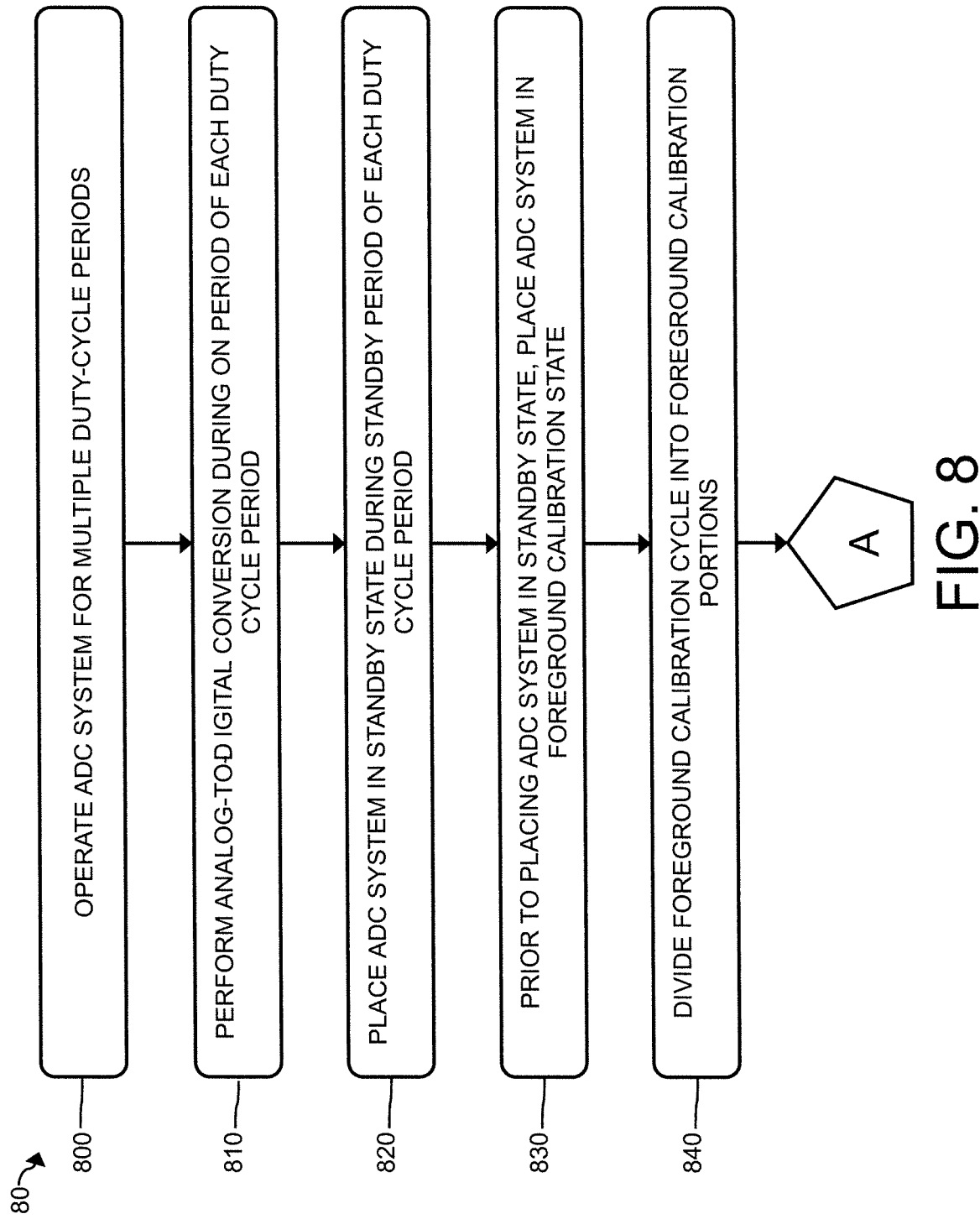
FIG. 8 is a flow chart of a method for performing foreground calibration in an ADC system while in duty-cycled operation.
Figure 8:
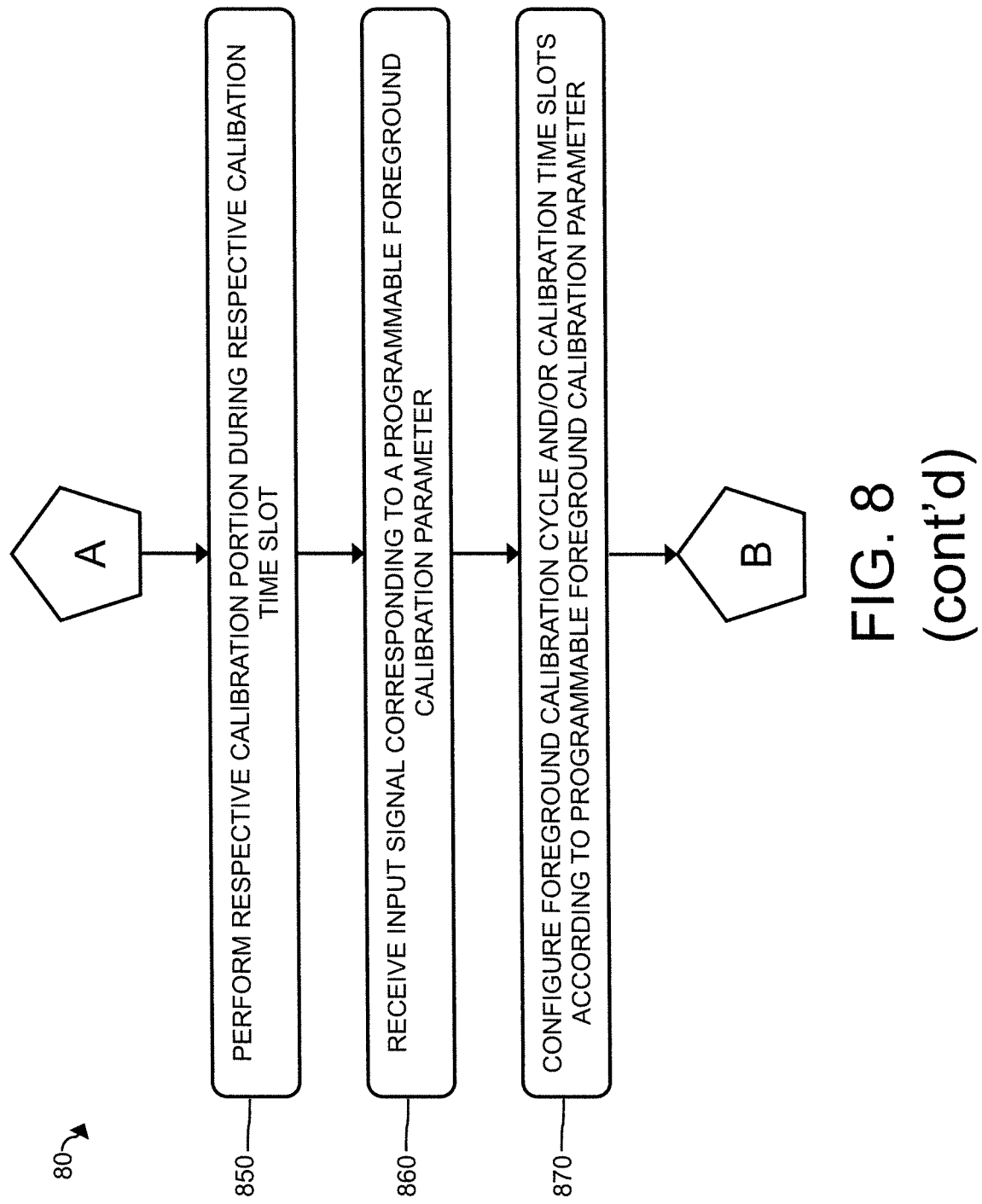
Figure 8:
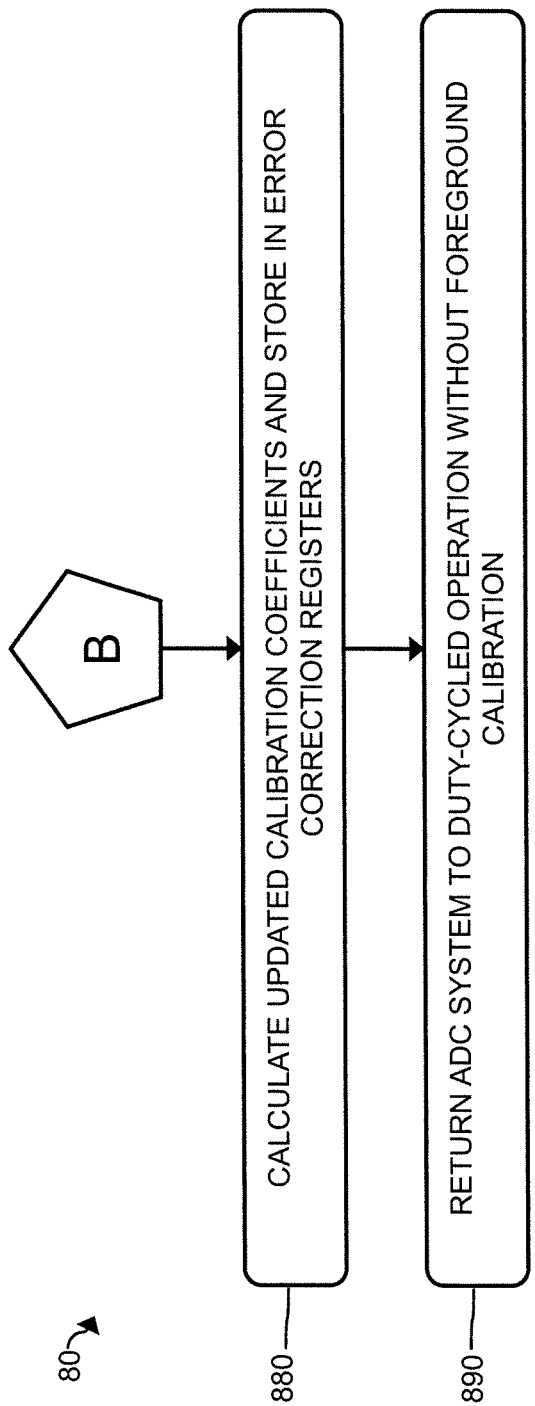

FIG. 8 is a flow chart of a method 80 for performing foreground calibration in an ADC system while in duty-cycled operation. Method 80 can be performed using ADC system 30.

In step 800, the ADC system operates in a duty-cycle manner for multiple duty-cycle periods. Each duty cycle period includes an ON period and a Standby period. The relative length of the ON period with respect to the duty-cycle period (e.g., the duty-cycle percentage) can be set by the master controller 340, such as through an input signal through control/status interface 345.

In step 810, the ADC system performs a respective analog-to-digital conversion of an analog input signal during the ON period of each duty-cycle period. The ADC system can apply any correction coefficients to the analog-to-digital conversion that were calculated in the last calibration.

In step 820, the ADC system is placed in a Standby state during the Standby period of each duty-cycle period. In the Standby state, the ADC system uses less power or current than in the ON state.

In step 830, before placing the ADC system in the Standby state of one of the duty cycles, the ADC system is placed in a foreground calibration state during a plurality of the Standby periods. When the ADC system is the foreground calibration state, the ADC system uses more power or current than the ADC system uses in the Standby state.

In step 840, a foreground calibration cycle is divided into a plurality of foreground calibration portions. Each calibration portion comprises a predetermined number of averaging calculations for one or more measurement conditions.

In step 850 (via placeholder A), a respective calibration portion is performed during a respective calibration time slot while the ADC system is in the foreground calibration state. Each calibration time slot comprises a portion of a respective Standby period. The calibration time slots can have a periodicity of 1 or more. When the periodicity is 1, the calibration time slots are located in consecutive Standby periods (e.g., in consecutive duty-cycle periods). When the periodicity is 2, the calibration time slots are located in every other Standby period. For example, consider first, second, and third consecutive Standby periods (with a corresponding ON period occurring before each Standby period). For a periodicity of 2, a first calibration time slot can be located in the first Standby period and a second calibration time slot can be located in the third Standby period with no calibration time slots located in the second Standby period. More generally, a calibration time slot is located in every N Standby period for a periodicity of N.

In step 860, an input signal is received that corresponds to one or more programmable foreground calibration parameters. The input signal can represent the value of one or more programmable registers (e.g., programmable control registers 350). For example, the programmable foreground calibration parameters can correspond to one or more of the programmable foreground calibration parameters in Table 1 (e.g., parameters A, N, M, and/or S).

In step 870, the foreground calibration cycle and/or the calibration time slots are configured according to programmable foreground calibration parameter(s). In one example, the width or length of the calibration time slots is configured according to the programmable foreground calibration parameter(s). The width or length of the calibration time slots can be set by through parameter A which controls the number of measurement averages that are calculated within a calibration time slot.

In another example, the number of calibration time slots is configured according to the programmable foreground calibration parameter(s). The number of calibration time slots can be set through parameter N which controls the number of time slots over which averaging is performed for each measurement condition. The number of calibration time slots can also be set through parameter M which controls the number of measurement conditions for the calibration cycle. The number of calibration time slots can be represented as N*M. Since parameter M controls the number of measurement conditions for the calibration cycle, this parameter also configures the foreground calibration cycle.

In another example, the periodicity of the calibration time slots is configured according to the programmable foreground calibration parameter(s). The periodicity of the calibration time slots can be set through parameter S.

After the foreground calibration portions are completed, the calibration coefficient values can be calculated (e.g., by the calibration coefficient computation circuits 380) in step 880 using the new foreground calibration data to provide updated calibration coefficient values. The updated calibration coefficient values are then stored in error correction registers that are accessible to the ADC circuits 310 and the digital error correction circuits 320. The updated calibration coefficient values are used by trim circuits in the ADC circuits 310 and the digital error correction circuits 320 to improve the accuracy of the analog-to-digital conversions of the analog input signal 315, which are performed by the ADC circuits 310.

In step 890, the ADC system returns to duty-cycled operation without performing foreground calibration (e.g., the ADC system not in a foreground calibration state). The ADC system uses the updated values in the error correction registers when performing the analog-to-digital conversions of the analog input signal 315.

The invention should not be considered limited to the particular embodiments described above. Various modifications, equivalent processes, as well as numerous structures to which the invention may be applicable, will be readily apparent to those skilled in the art to which the invention is directed upon review of this disclosure. The above-described embodiments may be implemented in numerous ways. One or more aspects and embodiments involving the performance of processes or methods may utilize program instructions executable by a device (e.g., a computer, a processor, or other device) to perform, or control performance of, the processes or methods.

In this respect, various inventive concepts may be embodied as a non-transitory computer readable storage medium (or multiple non-transitory computer readable storage media) (e.g., a computer memory of any suitable type including transitory or non-transitory digital storage units, circuit configurations in Field Programmable Gate Arrays or other semiconductor devices, or other tangible computer storage medium) encoded with one or more programs that, when executed on one or more computers or other processors, perform methods that implement one or more of the various embodiments described above. When implemented in software (e.g., as an app), the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more communication devices, which may be used to interconnect the computer to one or more other devices and/or systems, such as, for example, one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, a computer may have one or more input devices and/or one or more output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

The non-transitory computer readable medium or media may be transportable, such that the program or programs stored thereon may be loaded onto one or more different computers or other processors to implement various one or more of the aspects described above. In some embodiments, computer readable media may be non-transitory media.

The terms "program," "app," and "software" are used herein in a generic sense to refer to any type of computer code or set of computer-executable instructions that may be employed to program a computer or other processor to implement various aspects as described above. Additionally, it should be appreciated that, according to one aspect, one or more computer programs that when executed perform methods of this application need not reside on a single computer or processor, but may be distributed in a modular fashion among a number of different computers or processors to implement various aspects of this application.

Computer-executable instructions may be in many forms, such as program modules, executed by one or more computers or other devices. Generally, program modules include routines, programs, objects, components, data structures, etc. that performs particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Thus, the disclosure and claims include new and novel improvements to existing methods and technologies, which were not previously known nor implemented to achieve the useful results described above. Users of the method and system will reap tangible benefits from the functions now made possible on account of the specific modifications described herein causing the effects in the system and its outputs to its users. It is expected that significantly improved operations can be achieved upon implementation of the claimed invention, using the technical components recited herein.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. An analog-to-digital conversion system comprising:
a plurality of analog-to-digital conversion circuits configured to perform analog-to-digital conversions, the analog-to-digital conversion circuits having a first input that is electrically coupled to an analog input signal;
a plurality of digital error correction and formatting circuits having an input that is electrically coupled to an output of the analog-to-digital conversion circuits;
a plurality of calibration measurement circuits having an input that is electrically coupled to an output of the digital error correction and formatting circuits;
a plurality of calibration coefficient computation circuits having an input that is electrically coupled to an output of the calibration measurement circuits and an output that is electrically coupled to an input of the digital error correction and formatting circuits;
a plurality of control registers that represent programmable foreground calibration parameters;
a master controller having an output that is electrically coupled to the input of the analog-to-digital conversion circuits, the master controller configured for duty-cycled operation of the analog-to-digital conversion circuits, the duty-cycled operation including a plurality of duty cycle periods, each duty cycle period including (a) an ON period in which the analog-to-digital conversion circuits perform an analog-to-digital conversion of the analog input signal and (b) a standby period; and a digital calibration controller having a first output that is electrically coupled to the input of the analog-to-digital conversion circuits, a second output that is electrically coupled to the input of the calibration measurement circuits, and an input that is electrically coupled to the programmable control registers, wherein:

the digital calibration controller is configured to perform a portion of a foreground calibration cycle during a respective calibration time slot in a respective standby period and/or in a respective ON period, and the foreground calibration cycle and the respective calibration time slots are configurable according to the programmable foreground calibration parameters.

2. The analog-to-digital conversion system of claim 1, wherein a width of each respective calibration time slot is configurable according to the programmable foreground calibration parameters.

3. The analog-to-digital conversion system of claim 2, a number of measurement averages calculated in each calibration slot is configurable according to the programmable foreground calibration parameters.

4. The analog-to-digital conversion system of claim 1, wherein a periodicity of the respective calibration time slots is configurable according to the programmable foreground calibration parameters.

5. The analog-to-digital conversion system of claim 1, wherein a number of measurement conditions in the foreground calibration cycle is configurable according to the programmable foreground calibration parameters.

6. The analog-to-digital conversion system of claim 5, wherein a number of the respective foreground calibration time slots over which measurement averages are calculated for each measurement condition is configurable according to the programmable foreground calibration parameters.

7. The analog-to-digital conversion system of claim 1, wherein:

the calibration measurement circuits are configured to measure one or more calibration signals; and the calibration coefficient computation circuits are configured to calculate updated calibration coefficient values based on calibration measurements from the calibration measurement circuits.

8. The analog-to-digital conversion system of claim 1, wherein:

the analog-to-digital conversion circuits and the digital error correction and formatting circuits are configured to:

receive the updated calibration coefficient values from the calibration coefficient computation circuits, and use the updated calibration coefficient values to improve an accuracy of the analog-to-digital conversion of the analog input signal.

9. The analog-to-digital conversion system of claim 1, wherein the respective calibration time slots are configurable to occur at a transition from the ON period to the standby period.

10. The analog-to-digital conversion system of claim 1, wherein the respective calibration time slots are configurable to occur at a transition from the standby period to the ON period.

11. A method comprising:

operating an analog-to-digital converter for multiple duty-cycle periods, each duty-cycle period including an ON period and a standby period;

performing a respective analog-to-digital conversion of an analog input signal during the ON period of each duty-cycle period;

placing the analog-to-digital converter in a standby state during the standby period of each duty-cycle period;

prior to placing the analog-to-digital converter in the standby state, placing the analog-to-digital converter in a foreground calibration state during a plurality of the standby periods;

dividing a foreground calibration cycle into a plurality of foreground calibration portions;

performing a respective foreground calibration portion during a respective calibration time slot of the standby period while the ADC system is in the foreground calibration state;

receiving an input signal that corresponds to one or more programmable foreground calibration parameters; and configuring the foreground calibration cycle and/or the respective calibration time slots according to the programmable foreground calibration parameter(s).

12. The method of claim 11, further comprising updating a value of one or more programmable control registers according to the programmable calibration parameter(s).

13. The method of claim 11, further comprising configuring the width of each respective calibration slot according to the programmable calibration parameter(s).

14. The method of claim 13, further comprising configuring a number of measurement averages calculated in each respective calibration slot.

15. The method of claim 11, further comprising configuring a periodicity of the respective calibration time slots.

16. The method of claim 11, further comprising configuring a number of measurement conditions in the foreground calibration cycle.

17. The method of claim 16 wherein the method further comprises configuring a number of the respective calibration time slots over which measurement averages are calculated for each measurement condition.

18. The method of claim 11, further comprising:

measuring one or more calibration signals with calibration measurement circuits;

calculating updated calibration coefficient values with calibration coefficient computation circuits based on calibration measurements of the one or more calibration signals; and improving an accuracy of the respective analog-to-digital conversion using the updated calibration coefficient values.

19. A method comprising:

operating an analog-to-digital converter for multiple duty-cycle periods, each duty-cycle period including an ON period and a standby period;

performing a respective analog-to-digital conversion of an analog input signal during the ON period of each duty-cycle period;

placing the analog-to-digital converter in an ON state during the ON period of each duty-cycle period;

prior to placing the analog-to-digital converter in the ON state, placing the analog-to-digital converter in a foreground calibration state during a plurality of the ON periods;

dividing a foreground calibration cycle into a plurality of foreground calibration portions;

performing a respective foreground calibration portion during a respective calibration time slot of the ON period while the ADC system is in the foreground calibration state;
receiving an input signal that corresponds to one or more programmable foreground calibration parameters; and
configuring the foreground calibration cycle and/or the respective calibration time slots according to the programmable foreground calibration parameter(s).

* * * * *